(12) United States Patent
Okumura et al.

(10) Patent No.: US 6,784,011 B2
(45) Date of Patent: Aug. 31, 2004

(54) METHOD FOR MANUFACTURING THIN-FILM STRUCTURE

(75) Inventors: Mika Okumura, Tokyo (JP); Makio Horikawa, Tokyo (JP); Kiyoshi Ishibashi, Tokyo (JP); Takefumi Nishigami, Kumamoto (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/380,476

(22) PCT Filed: Jul. 23, 2001

(86) PCT No.: PCT/JP01/06360

§ 371 (c)(1),
(2), (4) Date: Mar. 20, 2003

(87) PCT Pub. No.: WO03/010828

PCT Pub. Date: Jun. 2, 2003

(65) Prior Publication Data

US 2003/0186480 A1 Oct. 2, 2003

(51) Int. Cl.7 .............................................. H01L 21/00
(52) U.S. Cl. .............................. 438/48; 438/50; 438/52; 438/783
(58) Field of Search .......................... 438/48, 50, 52, 438/783, 787

(56) References Cited

U.S. PATENT DOCUMENTS 5,550,090 A    8/1996  Ristic et al.
5,882,532 A  * 3/1999  Field et al. ............... 216/2
5,922,212 A  * 7/1999  Kano et al. ............... 216/2

FOREIGN PATENT DOCUMENTS

| JP | 4-99026 | 3/1992 |
|----|---------|--------|
| JP | 6-224189 | 8/1994 |
| JP | 07-142707 | 6/1995 |
| JP | 9-199496 | 7/1997 |
| JP | 09-260745 | 10/1997 |
| JP | 10-261806 | 9/1998 |
| JP | 2000-183364 | 6/2000 |

* cited by examiner

*Primary Examiner*—Alexander Ghyka
(74) *Attorney, Agent, or Firm*—Oblon, Spivak, McClelland, Maier & Neustadt, P.C.

(57) ABSTRACT

The present invention relates to a manufacturing method of a thin-film structural body which is formed by using a semiconductor processing technique, and an object thereof is to provide a manufacturing method of a thin-film structural body, capable of reducing a stress difference exerted between a sacrifice film and a substrate upon thermal shrinkage.

In order to achieve this object, a sacrifice film (51), which is formed on a substrate (1), is formed by using a PSG film in which the concentration of phosphorus is set to a value which is greater than 3 mol %, and also smaller than 4 mol %. After a thin-film layer (53) has been formed thereon and after the thin-film layer (53) has been patterned, the sacrifice film (51) is removed by an etching process.

6 Claims, 3 Drawing Sheets

METHOD FOR MANUFACTURING THIN-FILM STRUCTURE

TECHNICAL FIELD

The present invention relates to a manufacturing method of a thin-film structural body which includes: a substrate; and a thin-film body formed on a sacrifice film formed on the substrate and placed with a predetermined gap from the substrate after removal of the sacrifice film.

BACKGROUND ART

In a thin-film structural body of this type to which the present invention is applied, a stress difference is exerted between the substrate and the sacrifice film, for example, after an annealing process carried out after the formation of the sacrifice film, with the result that cracks might occur on the substrate or the sacrifice film or both of the substrate and the sacrifice film due to the stress difference.

With respect to this problem, in a conventional thin-film structural body, a TEOS (tetraethylorthosilicate) oxide film is formed on the substrate as a sacrifice film, and after a thin-film body has been formed on the TEOS oxide film, the TEOS oxide film is removed.

However, in the case when the sacrifice film is formed by the TEOS oxide film in this conventional method, the resulting problem is that a great stress difference occurs between the sacrifice film and the substrate upon thermal shrinkage.

DISCLOSURE OF THE INVENTION

The present invention has been devised to solve the above-mentioned problem, and an object thereof is to provide a manufacturing method of a thin-film structural body, capable of reducing a stress difference exerted between a sacrifice film and a substrate upon thermal shrinkage.

In a first aspect of a manufacturing method of a thin-film structural body according to the present invention, in a manufacturing method of a thin-film structural body which includes: a substrate (1); and a thin-film body (21, 23, 25) formed on a sacrifice film (51) formed on the substrate and placed with a predetermined gap from the substrate by the removal of the sacrifice film, the sacrifice film is formed by a silicon oxide film in which phosphorus is mixed in a value of concentration greater than 3 mol %.

According to this aspect, since the sacrifice film is formed by the silicon oxide film in which phosphorus is mixed in a value of concentration greater than 3 mol %, it is possible to reduce a stress difference exerted between the sacrifice film and the substrate upon thermal shrinkage, while suppressing a segregation of phosphorus in the silicon oxide film, and consequently to prevent the generation of cracks.

In a second aspect of the manufacturing method of a thin-film structural body according to the present invention, the value of concentration of phosphorus is set to a value that is greater than 3 mol %, and also smaller than 4 mol %.

According to this aspect, since the value of concentration of phosphorus is set to a value that is greater than 3 mol %, and also smaller than 4 mol %, it is possible to reduce a stress difference exerted between the sacrifice film and the substrate upon thermal shrinkage, while suppressing a segregation of phosphorus in the silicon oxide film.

In a third aspect of the manufacturing method of a thin-film structural body according to the present invention, the sacrifice film is formed by a PSG film.

According to this aspect, since the sacrifice film is formed by a PSG film having a high etching rate, it is possible to easily remove the sacrifice film through an etching process.

In a fourth aspect of the manufacturing method of a thin-film structural body according to the present invention, the sacrifice film is formed by a BPSG film.

According to this aspect, since the sacrifice film is formed by a BPSG film having a high etching rate, it is possible to easily remove the sacrifice film through an etching process.

Moreover, it is possible to improve the reflow property of the sacrifice film by the effect of boron mixed into the BPSG film.

In a fifth aspect of the manufacturing method of a thin-film structural body according to the present invention, the substrate forms a sensor substrate installed in an acceleration sensor, and the thin-film body forms at least one portion of a sensor unit (3) which is installed in the acceleration sensor and which has a function of detecting the acceleration.

According to this aspect, it is possible to prevent cracks from generating in the manufacturing process of the sensor unit of the acceleration sensor.

These and other objects, features, aspects and advantages of the present invention will become more apparent in conjunction with the following detailed description and the accompanying drawings.

BEST MODE FOR CARRYING OUT THE INVENTION

1. Embodiment 1

Figure 1:
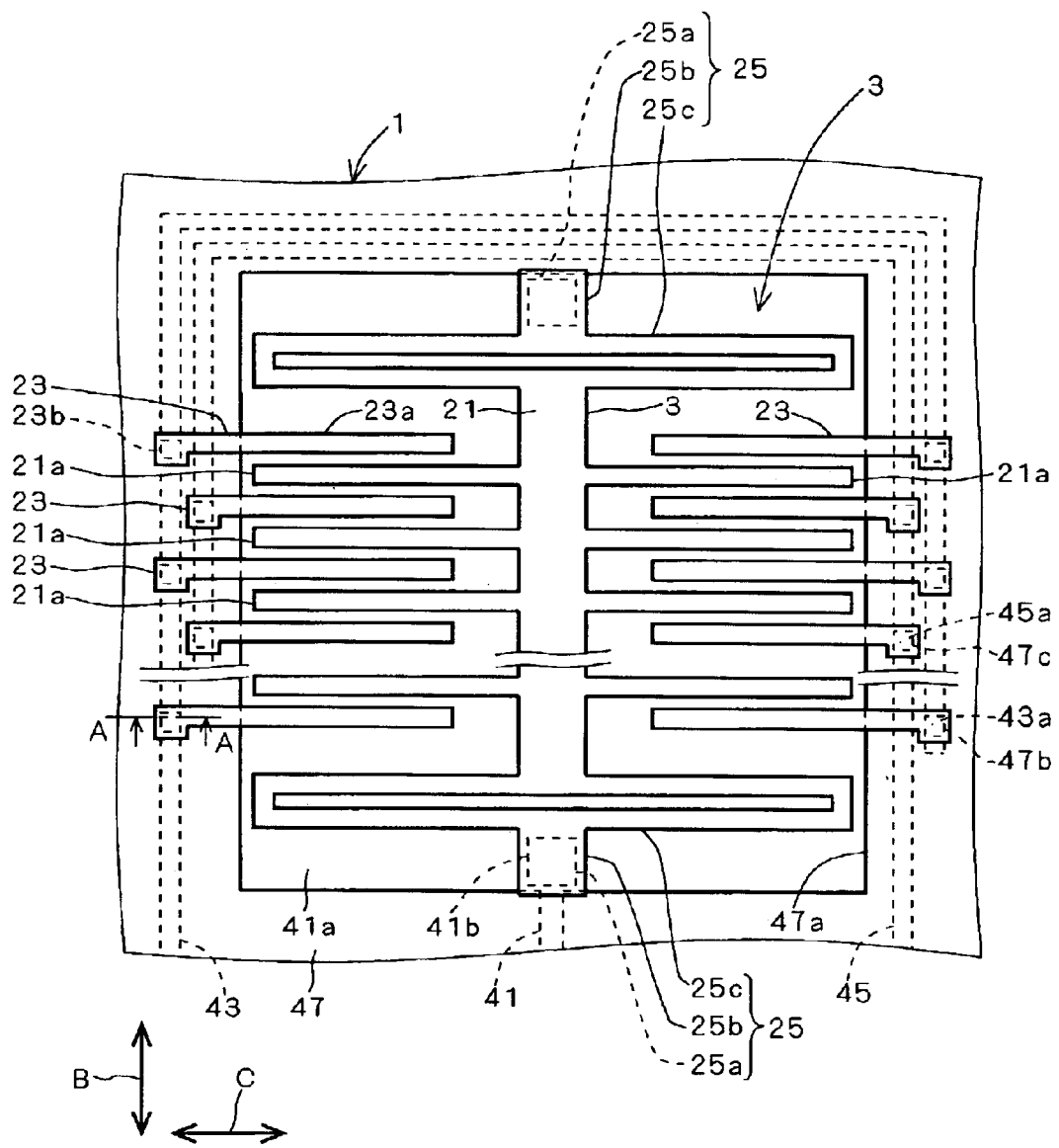
FIG. 1 is a plan view showing a configuration of a main parts of a semiconductor acceleration sensor to which a manufacturing method of a thin-film structural body according to embodiment 1 of the present invention is applied.
Figure 2:
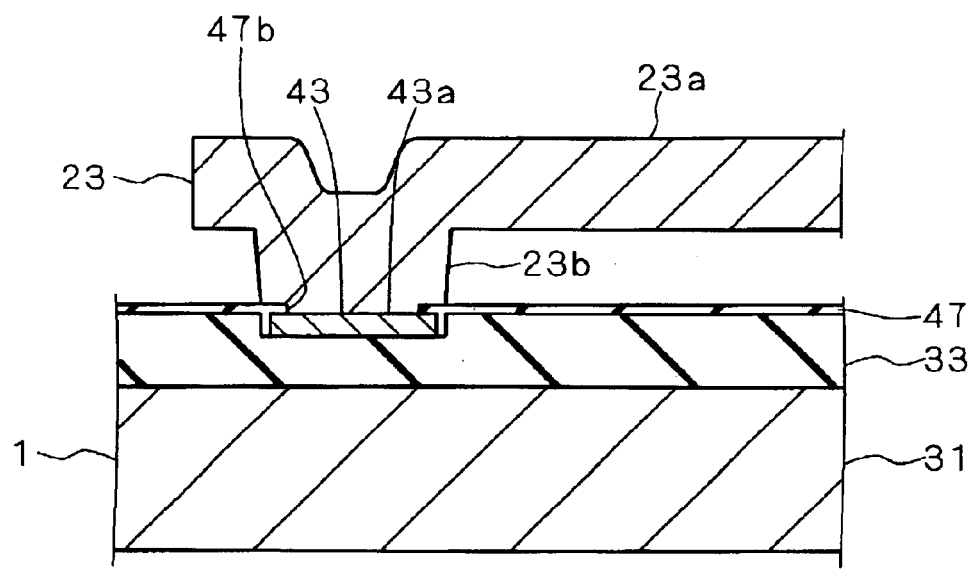
FIG. 2 is a cross-sectional view taken along line A—A of FIG. 1.

As shown in FIGS. 1 and 2, a semiconductor acceleration sensor to which a manufacturing method of a thin-film structural body according to embodiment 1 of the present invention is applied is provided with a substrate 1 which is a sensor substrate and a sensor unit 3 which is formed on the substrate 1 and which has a function of detecting the acceleration.

As shown in FIG. 1, the sensor unit 3 is provided with a mass body 21 functioning as a movable electrode, a plurality of fixed electrodes 23 and a plurality of beams 25. The mass body 21, the fixed electrodes 23 and the beams 25, which correspond to the thin-film body of the present invention, are formed by a conductive material, such as doped polysilicon made by doping polysilicon with impurities such as phosphorus.

The mass body 21 has a plurality of movable electrode portions 21a which are placed with a predetermined gap from the substrate 1 and which extend in direction C perpendicular to direction B of acceleration to be detected. The beams 25, which are formed integrally with the mass body 21, have a function of suspending the mass body 21 over the substrate 1 in a manner so as to move in direction B with a restoring force. Each of the beams 25 is provided with a supporting portion 25a protruding from the substrate 1, a connecting portion 25b connected to the supporting portion 25a and a spring portion 25c placed between the connecting portion 25b and the edge of the mass body 21 with respect to direction B. The spring portion 25c is elastically bent so that the distance between the connecting portion 25b and the mass body 21 in direction B is increased and decreased.

The respective fixed electrodes 23 are formed in direction C with predetermined distances from each other in direction B. Moreover, each fixed electrode 23 is provided with a fixed electrode portion 23a, which serves as a floating portion, placed with a predetermined distance from the substrate 1, and a supporting portion 23b for supporting the fixed electrode portion 23a.

The fixed electrode portions 23a of the respective fixed electrodes 23 and the movable electrode portions 21a of the mass body 21 are alternately placed with distances from each other in direction B to form a capacitor. Thus, based upon a change in the capacity of the capacitor caused by a shift of the movable electrode portion 21a, the acceleration is detected.

As shown in FIGS. 1 and 2, the substrate 1 is provided with a substrate main body 31 formed by a semiconductor such as silicon, a silicon oxide film 33 serving as a first insulating film formed on the substrate main body 31, a plurality of wires 41, 43, 45, selectively formed on the silicon oxide film 33, and a nitride film 47 serving as a second insulating film for selectively covering the surface of the wires 41, 43, 45 and the surface of the silicon oxide film.

The wire 41 is provided with an exposed portion 41a placed in an exposed state on an opposing area of the substrate 1 facing the mass body 21 above the substrate 1, and a contact portion 41b placed below the supporting portion 25a, and electrically connected to the supporting portion 25a. The wires 43, 45 are used for extracting signals from the fixed electrode 23, and connected to the respective fixed electrodes 23 through their contact portions 43a, 45a.

In a corresponding manner, a window section 47a and hole sections 47b, 47c are formed in the nitride film 47. Through the window section 47a, the exposed portion 41a of the wire 41 is exposed on the substrate 1, and the contact portion 41a is electrically connected to the supporting portion 25a. The contact portions 43a, 45a of the wires 43, 45 are electrically connected to the fixed electrode 23 through the hole sections 47b, 47c.

In response to such the configuration of the semiconductor acceleration sensor, in the present embodiment, the mass body 21, beams 25 and fixed electrode 23 are formed by the following manufacturing method.

Figure 3:
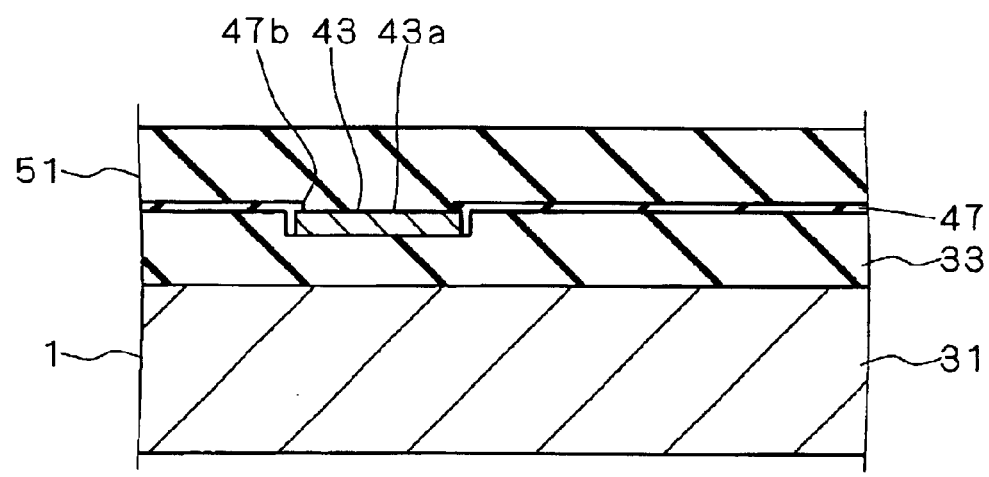
FIGS. 3 and 4 are views showing manufacturing processes of the structure shown in FIG. 2.

First, as shown in FIG. 3, a sacrifice film 51, made of a PSG (phosphosilicateglass) film serving as a silicon oxide film, is formed on the substrate 1. In the present embodiment, the concentration of phosphorus in this PSG film is set to a value greater than 3 mol %, and also smaller than 4 mol %, so that it becomes possible to reduce a stress difference exerted between the sacrifice film 51 and the substrate 1 upon thermal shrinkage.

In this case, the values of 3 mol % and 4 mol % that form references in a setting range of the phosphorus concentration are determined based upon results of tests. The lower limit value of 3 mol % is set so that the concentration of phosphorus lower than this value fails to provide a sufficient reducing effect of the stress difference. Moreover, the upper limit value of 4 mol % is set so that the concentration of phosphorus higher than this value causes a segregation of phosphorus in the PSG film, failing to remove the segregated portion of phosphorus in the sacrifice film 51 at the time of an etching process and causing a residual portion therein.

Figure 4:
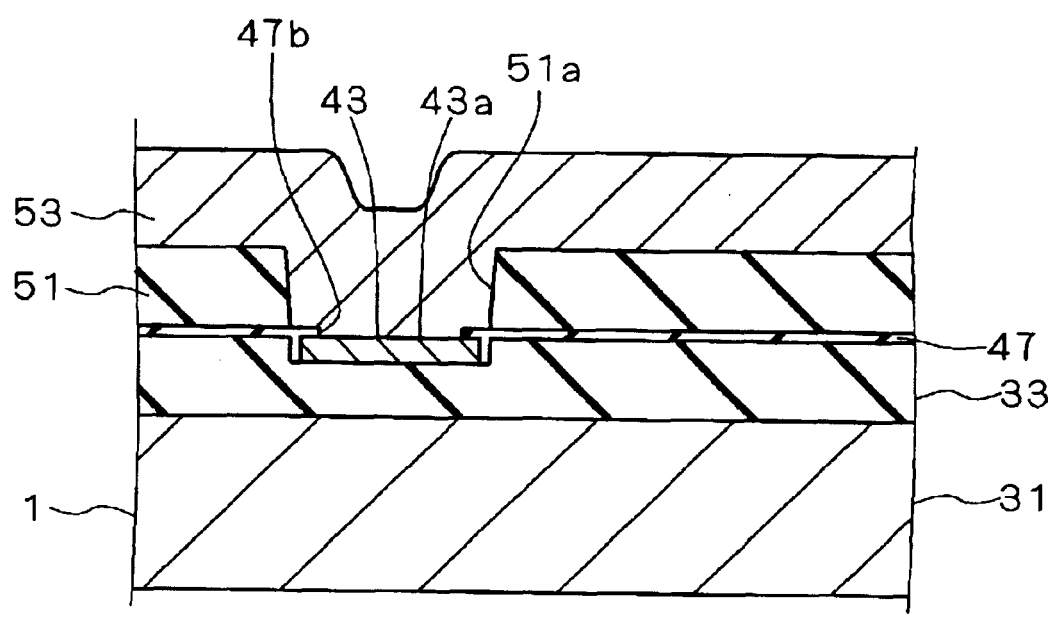

Successively, portions of the sacrifice film 51, at which supporting portions 25a, 23b are to be formed, are selectively removed to form the anchor hole section 51a, and a thin-film layer 53 is formed from a conductive material, for example, a doped polysilicon, on the residual sacrifice film 51 and the substrate 1 exposed through the anchor hole section 51a. Thus, a structure shown in FIG. 4 is obtained.

Then, the thin-film layer 53 is selectively removed and patterned, so that the residual thin-film layer 53 are allowed to form the mass body 21, the beams 25 and the fixed electrode 23. At this time, portions of the residual portion, fitted into the anchor hole section 51a, form the supporting portions 25a, 23b, and the portions located on the sacrifice film 51 form the mass body 21, the spring portion 25c, the connecting portion 25b and the fixed electrode portion 23a. Then, the sacrifice film 51 is removed by an etching process, so that a structure shown in FIGS. 1 and 2 is obtained.

As described above, according to the present embodiment, the sacrifice film 51 is formed by using a PSG film in which phosphorus is mixed at a value of concentration which is greater than 3 mol % and also smaller than 4 mol %, so that it is possible to reduce a stress difference exerted between the sacrifice film 51 and the substrate 1 upon thermal shrinkage, while suppressing a segregation of phosphorus in the PSG film, and consequently to prevent the generation of cracks in manufacturing processes of a sensor unit 3 of a semiconductor acceleration sensor.

Moreover, since the sacrifice film 51 is formed by the PSG film having a high etching rate, it is possible to easily remove the sacrifice film by an etching process.

2. Embodiment 2

A manufacturing method of a thin-film structural body according to the present embodiment is also applied to a semiconductor acceleration sensor shown in FIGS. 1 and 2. Here, the manufacturing method according to the present embodiment is substantially different from the above described manufacturing method of embodiment 1 only in that the sacrifice film 51 is formed by a different forming method. Therefore, the following description will be given of only the point that is substantially different from the manufacturing method according to embodiment 1.

According to the manufacturing method of the present embodiment, the sacrifice film 51 is formed by using a BPSG (borophosphosilicateglass) film serving as a silicon oxide film in which the concentration of phosphorus is set in a predetermined range. Also in the present embodiment, the concentration of phosphorus in the BPSG film is set to a value which is greater than 3 mol %, and also smaller than 4 mol %. Here, the concentration of boron in the BPSG film is set to a general value, for example, 2.2 mol %.

Thereby, also in the present embodiment, it is possible to reduce a stress difference exerted between the sacrifice film 51 and the substrate 1 upon thermal shrinkage, while suppressing a segregation of phosphorus in the BPSG film, and consequently to prevent the generation of cracks in manufacturing processes of a sensor unit 3 of a semiconductor acceleration sensor.

Moreover, since the sacrifice film 51 is formed by the BPSG film having a high etching rate, it is possible to easily remove the sacrifice film by an etching process.

Furthermore, it is possible to improve the reflow property of the sacrifice film by the effect of boron mixed into the BPSG film.

While the present invention has been described in detail, the above description is illustrative in all aspects and the present invention is not restricted thereto. It will be understood that numerous variants which are not illustrated can be supposed without departing from the scope of the invention.

What is claimed is:

1. A manufacturing method of a thin-film structural body which comprises: a substrate; and a thin-film layer formed above said substrate with a predetermined gap from said substrate, comprising:

forming a sacrifice film made of a silicon oxide film in which phosphorus is mixed in a value of concentration greater than 3 mol % and less than 4 mol %;

selectively removing said sacrifice film;

forming said thin-film layer on a residual portion of said sacrifice film and said substrate; and removing said residual portion of said sacrifice film.

2. The manufacturing method of a thin-film structural body according to claim 1, wherein said sacrifice film is formed by a PSG film.

3. The manufacturing method of a thin-film structural body according to claim 1, wherein said sacrifice film is formed by a BPSG film.

4. The manufacturing method of a thin-film structural body according to claim 1, wherein said substrate forms a sensor substrate installed in an acceleration sensor, and said thin-film layer forms at least one portion of a sensor unit which is installed in said acceleration sensor and which has a function of detecting acceleration.

5. The manufacturing method of a thin-film structural body according to claim 2, wherein said substrate forms a sensor substrate installed in an acceleration sensor, and said thin-film layer forms at least one portion of a sensor unit which is installed in said acceleration sensor and which has a function of detecting acceleration.

6. The manufacturing method of a thin-film structural body according to claim 3, wherein said substrate forms a sensor substrate installed in an acceleration sensor, and said thin-film layer forms at least one portion of a sensor unit which is installed in said acceleration sensor and which has a function of detecting acceleration.

* * * * *